United States Patent [19]

Raider et al.

[11] 4,422,040
[45] Dec. 20, 1983

[54] METHOD OF TESTING STEPPING MOTORS

[75] Inventors: Jerry W. Raider; Earl D. Ward, II, both of Lexington, Ky.

[73] Assignee: International Business Machines Corporation, Armonk, N.Y.

[21] Appl. No.: 318,492

[22] Filed: Nov. 5, 1981

[51] Int. Cl.³ .................................... G05B 19/40
[52] U.S. Cl. ..................... 324/158 MG; 318/331; 318/490; 318/696
[58] Field of Search ............... 324/158 MG; 318/331, 318/490, 696; 322/99

[56] References Cited

U.S. PATENT DOCUMENTS

| | | | |
|---|---|---|---|
| 2,568,406 | 9/1951 | Packer et al. | 324/158 MG |
| 3,818,297 | 6/1974 | Ha et al. | 318/331 |
| 3,942,111 | 3/1976 | Pfouts | 318/490 |
| 4,292,574 | 9/1981 | Sipin et al. | 318/490 |
| 4,330,739 | 5/1982 | Chiang | 318/696 |

FOREIGN PATENT DOCUMENTS 2020555 2/1973 Fed. Rep. of Germany .
864440 9/1981 U.S.S.R. ..................... 324/158 MG

*Primary Examiner*—Stewart J. Levy
*Attorney, Agent, or Firm*—William J. Dick

[57] ABSTRACT

A method for quickly testing stepping motors (10). The motor phases (ΦA–ΦC) are connected in series, and a constant current is applied to the phases. The rotor (12) of the motor (10) under test is rotated unidirectionally at a constant speed, and the voltage drop across each phase is measured and converted into back EMF. The back EMF is then analyzed to determine a characteristic of the motor (10), for example stepping accuracy of each of the phases, or related torque information, and the result of the analysis is then compared with a predetermined motor parameter to provide comparison data or a signal of a pass or fail condition based upon the comparison.

29 Claims, 16 Drawing Figures

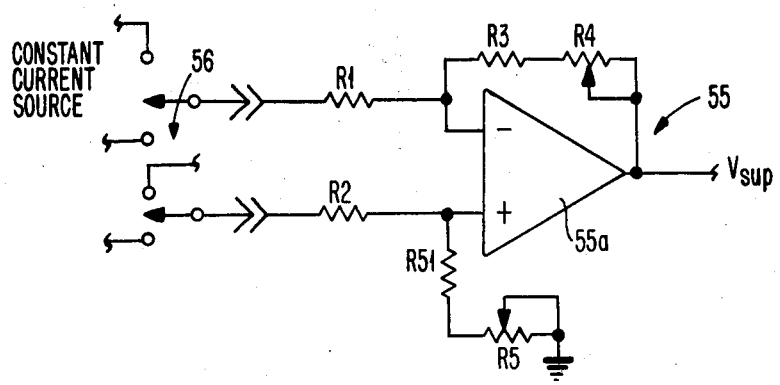
FIG. 4a
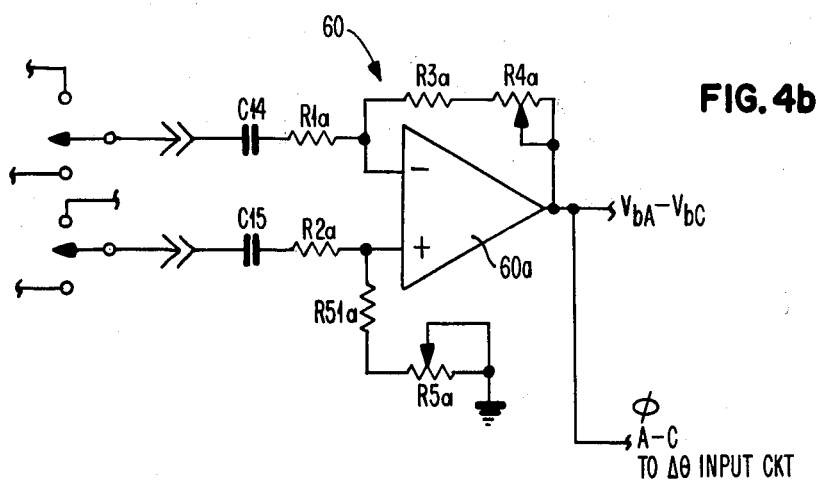
FIG. 4b
FIG. 5
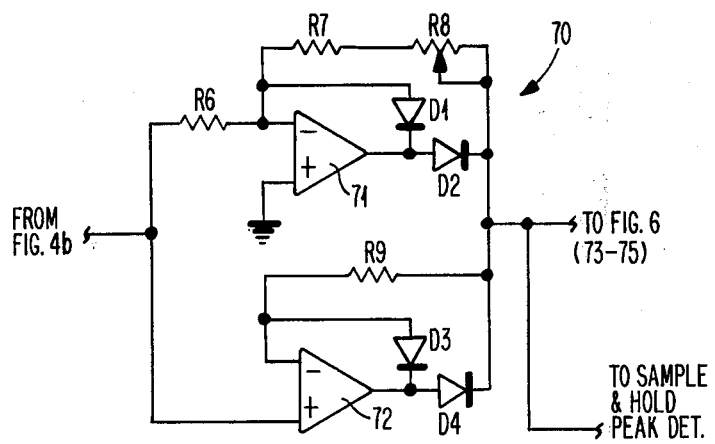

METHOD OF TESTING STEPPING MOTORS

SUMMARY OF THE INVENTION AND STATE OF THE PRIOR ART

The present invention relates to a method for quick testing stepping motors, and more particularly relates to a method for testing stepping motors in which the back EMF of the motor is determined, and then analyzed for comparison against desired motor parameters to determine whether the motor meets the required predetermined motor characteristics.

Stepping motors required for use in printers, such as moving carrier daisy wheel typewriters and the like require tight tolerance specifications with regard to torque exhibited by each phase of the stepping motor as well as stepping accuracy and damping efficiency of the motor. Each of the motors for the printer is conventionally designed to exhibit some varying tendencies to operate for sustained periods of time under design load conditions. Conventional practice has been to utilize separate testers to determine each of the various parameters and acceptability levels for each motor. For example, to determine whether a winding is shorted or open, it is conventional practice to employ a simple ohm meter or, in more sophisticated tests, a wein bridge. Torque tests are conventionally conducted by the use of a dynamometer while precise angular measurements to determine the stepping accuracy of the motor may be found in a more conventional manner by measuring the angle, with a high degree of accuracy by opto-electronic or other standard means. Each of these tests requires set up time, multiple test instruments and generally an exorbinate amount of time and labor to carry out the tests. Alternatively, tests may be conducted on a statistical or random basis so that every stepping motor is not tested and as a result, in the field breakdown, or final product test results in a high failure rate. The latter condition is especially true when the printer may contain four or more stepping motors to operate the various functions of the printer.

It has been determined that if the true back EMF of a stepping motor may be ascertained by analysis all of the required parameters of the stepping motor may be compared with known desired parameters so that a simple reject or accept decision may be made.

The prior art discloses the ability to employ true back EMF for various purposes. For example, U.S. Pat. No. 3,813,591 discloses a speed control circuit for utilizing the true back EMF of a motor to accurately determine the speed of the motor. The true back EMF however is determined during each half cycle when the armature voltage is solely a function of the back EMF.

In U.S. Pat. No. 3,818,297, disclosed is an apparatus for controlling the speed of a motor while sampling the back EMF in order to determine the actually operating speed of the motor. In U.S. Pat. No. 3,663,878 is disclosed a means of utilizing back EMF for detecting the position of the rotor of the DC motor while in U.S. Pat. No. 3,283,235 a means of utilizing back EMF to regulate and control the amount of energy supplied to a motor for controlling the speed of the motor is disclosed.

U.S. Pat. No. 2,649,572 discloses a circuit which derives a voltage directly proportional to the back EMF of a motor operating in half-wave rectifier systems.

None of the art discloses the use of true back EMF to test stepping motors to derive their operational characteristics when compared with specified parameters.

Thus, the present invention encompasses a method of testing a stepping motor in which the phases of the motor under test are connected in series. A constant current is then applied to the phases and the rotor of the motor is rotated unidirectionally at a constant speed. The voltage drop across each of the phases is detected and converted into back EMF for each of the phases. The back EMF of the phases is then analyzed to determine a parameter of the motor, and the parameter is compared with a known comparable parameter.

Other advantages of the method of the present invention will become apparent in relation to the following drawings and specification taken in conjunction with the accompanying claims.

DRAWING DESCRIPTION

FIG. 4a is a schematic diagram of a DC coupled differential amplifier shown in the block diagram of FIG. 3;

FIG. 4b is a schematic diagram of a typical AC coupled differential amplifier illustrated in block form in FIG. 3;

FIG. 5 is a schematic diagram of a typical full wave rectifier which may be employed in the circuitry of the block diagram illustrated in FIG. 3;

THE STEP MOTOR

Figure 1:
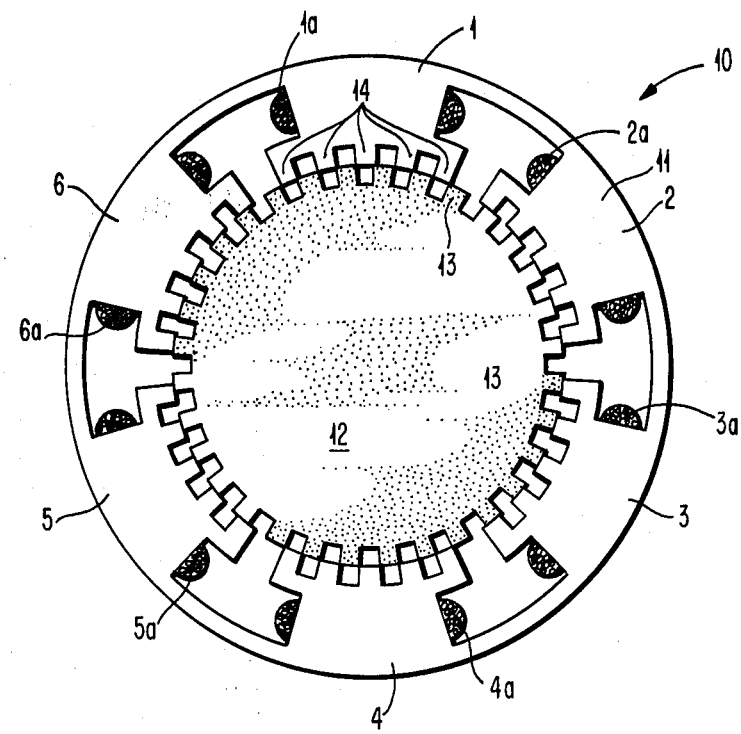
FIG. 1 is a schematic cross-sectional view through a sample stepping motor which is to be tested in accordance with the method of the present invention.

Turning now to FIG. 1 of the drawing, illustrated therein is a three-phase, variable reluctance, 96-step per revolution stepping motor 10. As illustrated, the example step motor 10 includes a stator assembly 11 with six salient poles labeled 1–6 respectively, each of the poles including a winding 1a–6a respectively. The windings of opposite poles, in the present instance, are connected in series forming a three-phase motor. Thus, the winding 1a of pole 1 is in series with winding 4a of pole 4, winding 2a of pole 2 is in series with winding 5a of pole 5, and winding 3a of pole 3 is in series with winding 6a of pole 6. Thus there are two salient poles per phase. In this example motor, the rotor 12 has 32 teeth 13, while there are 5 teeth 14 associated with each of the salient poles. (The number of teeth 13 in the rotor, times the number of phases, equals the number of steps per revolution of the motor. Thus, in the sample given there are $3 \times 32 = 96$ steps per revolution of the rotor.)

Each coil 1a-6a of the step motor 10 is capable of providing a contribution to the total torque delivered by the motor to a load. In the example given, it is assumed that it is unnecessary to track the torque contribution of an individual coil of the stator. The individual instantaneous electromechanical properties of each phase of the motor are tracked in accordance with the testing method of the present invention. This assumption halves the mathematical order of the electromechanical system at no apparent loss in accuracy.

Moreover, for the example motor tested, it is assumed that each phase is uneffected by the current in any other phase and that the total torque produced by the motor is the sum of the torque produced by each phase as if only that phase were energized. This assumption assumes negligible mutual coupling between the coils 1a-6a. Both the physical configuration of the motor and experimental evidence support the assumptions for the sample motor above described, i.e., the 96-step-per revolution variable reluctance motor 10.

The Method of the Present Invention and Background

The method of the present invention encompasses the steps of connecting phases of the motor under test in series; applying a constant current to the series connected phases, rotating the shaft of the motor in a first direction and at a constant speed; detecting the voltage drop across at least one phase and converting the detected voltage into back EMF for the at least one phase; analyzing the back EMF for the at least said one phase to determine a parameter of the motor and comparing the parameter with a known comparable parameter of an acceptable motor.

Traditional testing of stepping motors (torque versus position, for example) is, of course, still an extremely valuable tool. Good measurement of torque, however, requires sensitive equipment such as high quality slip rings and a torque cell maintained in a laboratory environment. With a large volume of stepping motors in a production type environment, such testing as by a torque cell and the like is impractical if for no other reason than the time required to set up each motor for testing. While sample testing (statistical) may be a solution to the problem, if the motors are going to be employed in critical operations, for example open loop operations, a test that will adequately indicate whether the motor will work when put into such an application is most desirable for each individual motor.

To this end, and as will be shown hereafter, the measurement of back EMF voltage is an excellent way to determine the prediction of the quality of the motor. Following is a description of how the measurement of back EMF is obtained, and how it is utilized to obtain the parameters of the motor for comparison purpose. These motor parameters are: (1) The stepping accuracy of the motor; (2) The running torque; (3) Phase to phase variations in the motor; (4) Variations within a single phase of the motor; (5) The damping efficiency of the motor; (6) The rotor-stator gap width; (7) Short condition; (8) Open conditions, (9) Hysteretic losses, and (10) Inductance.

Torque-Back EMF Relationship

The familiar circuit equation used to complete a motor loop (in the present instance, one phase of a stepping motor) is $$L(i,\theta)\frac{di}{dt} = e_a - iR - V_B(i,\theta) \quad (1)$$

where L is the inductance of the coil as a function of current, i, and rotational position, $\theta$; $e_a$ is the voltage applied to the coil; iR is the voltage drop due to the resistance, R, of the coil; and $V_B$ is the back EMF voltage generated in the coil, which is also a function of current and position.

If a constant or controlled current source (which will be described in more detail with reference to FIG. 9 hereinafter) applys current through the coil, and the rotor of the motor is caused to rotate so that the motor acts as a generator, and the resultant signal is AC coupled, equation (1) becomes:

$$e_a' = V_B(i, \theta) \quad (2)$$

thus eliminating any concerns of inductance. Thus the current source must hold the current constant in the face of an inductive load presented by the phases of the motor. The reasons for these conditions becomes clear when torque is related to the back EMF measurement.

The key to the relationship between back EMF and torque may be found from equation (3) and equation (4) given below.

$$V_B(i,\theta) = K_e(i,\theta)\frac{d\theta}{dt} \quad (3)$$

$$\frac{\partial T}{\partial i}(i,\theta) = K_e(i,\theta) = \frac{\partial \lambda}{\partial \theta}(i,\theta) \quad (4)$$

In these equations, $K_e$ is the back EMF coefficient, T is torque, and $\lambda$ is flux linkage.

By equation (4), for any position of the rotor 12, the derivative of torque with respect to current is equal to some back EMF coefficient $K_e$. This relation may be extended to back EMF by multiplying $K_e$ by the speed of rotation, $((d\theta)/dt)$.

Figure 2:
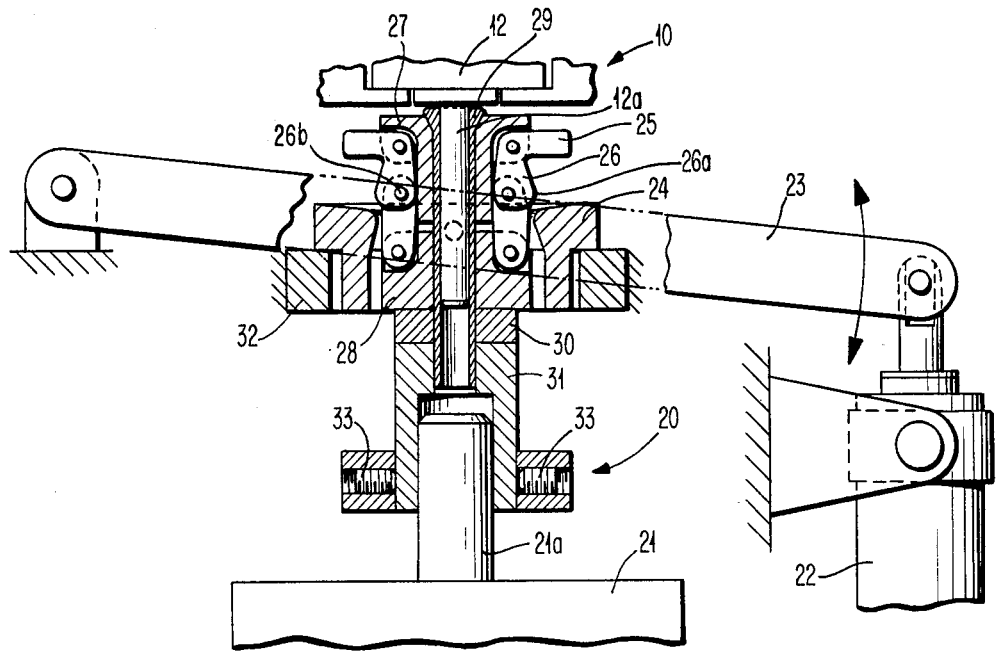
FIG. 2 is a fragmentary side elevational view of a holder to effect rotation of the motor shaft or rotor of the motor illustrated in FIG. 1.

The tester of the present invention achieves this condition by rotating the rotor 12 at a constant speed by coupling the rotor 12 through its shaft 12a to shaft rotating means 20 (see FIG. 2). In the illustrated instant the shaft rotating means 20 includes a servo motor 21 and an associated jig or fixture 22, described hereinafter, for quickly coupling and uncoupling the shaft 21a of the servo motor to the shaft 12a of the motor 10.

Figure 10:
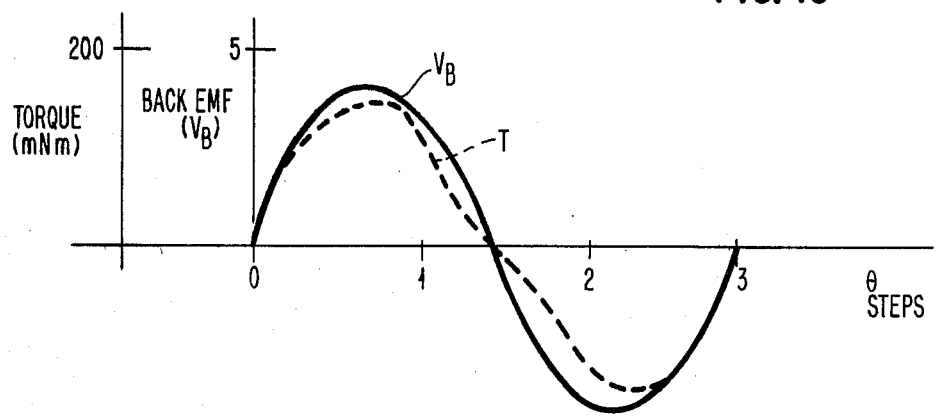
FIGS. 10–12 are schematic graphs which are employed in the explanation of the various signals and motor parameters derived from the circuitry illustrated in FIGS. 3–9.

By rotating the shaft 12a or rotor 12 of the motor 10 at a constant speed, the back EMF will differ from the back EMF coefficient only by a speed multiplication factor. Equation (4) also indicates that the back EMF coefficient $K_e$ is also equal to the partial derivative of flux linkage, which may be employed in the determination of average running torque. Typical back EMF ($V_B$) and torque (T) curves of one torque cycle (holding speed and current constant at, for example, 200 steps per second and 750 ma respectively, with AC coupling, the back EMF voltage $V_B$ generated in the coil) is shown in FIG. 10.

Figure 3:
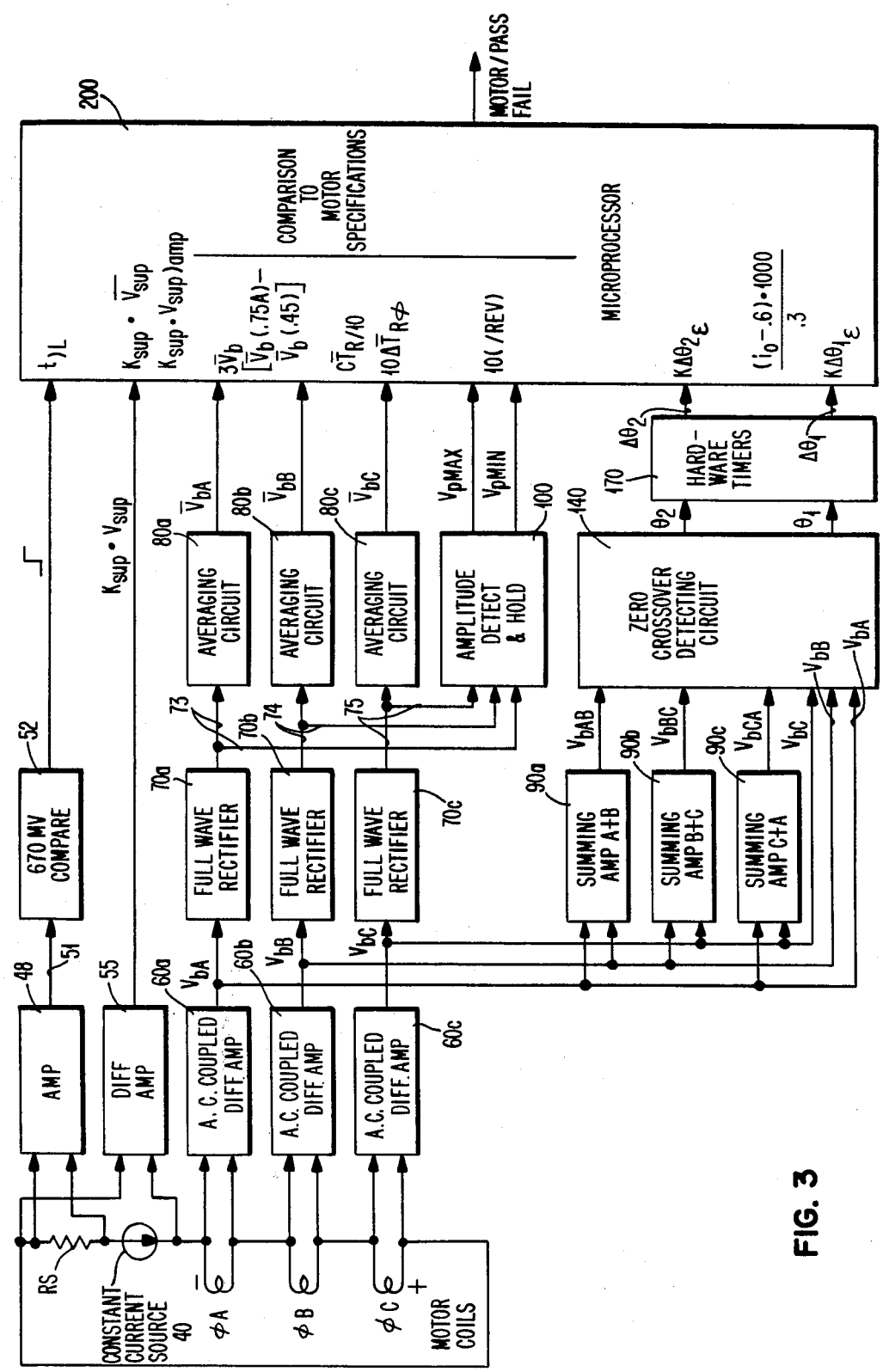
FIG. 3 is a schematic block diagram of the circuitry employed to determine the back EMF of the motor under test and for deriving therefrom a parameter of the motor under test.

The block diagram of FIG. 3 shows the layout of the tester, and will be referred to more completely in the section of this specification entitled "Tester Implementation".

Certain conditions which are basic to all testing accomplished in accordance with the method of the present invention have been heretofore eluded to but are once again summarized below:

(1) The motor shaft 12a is rotated by the shaft rotating means 20 in one direction.
(2) Rotation is held constant, in the discussion hereinafter, at 300 steps per second.
(3) Current is held constant at five separate levels (for example purposes only, 150, 300, 450, 600 and 750 ma for 750 ma motors). However, it is unnecessary that all parameters are measured at each level.
(4) All three motor phases are energized simultaneously by series connecting the coils $\Phi A-\Phi C$. This speeds the testing procedure, allowing information to be obtained from all phases at once. By connecting the phases in series, a considerable reduction in the power requirements of the shaft rotating means 20 or servo motor 21 is necessitated. Moreover, series connection of the motor coils for the phases $\Phi A-\Phi C$ as illustrated schematically in FIG. 3, also reduces the load on the constant current source facilitating measurement of average inductance and resistance.

FUNCTIONS

Step Accuracy Measurement

Considering the basis of stepping motor operation, that of converting electrical pulses into discrete rotational movements (steps), the quality of a motor is dependent upon the accuracy of the steps. In accordance with the theory heretofore set forth, as seen in the torque and back EMF versus position diagram, FIG. 10, back EMF and torque both pass through the zero point of the ordinate of the diagram at the same locations.

Figure 11:
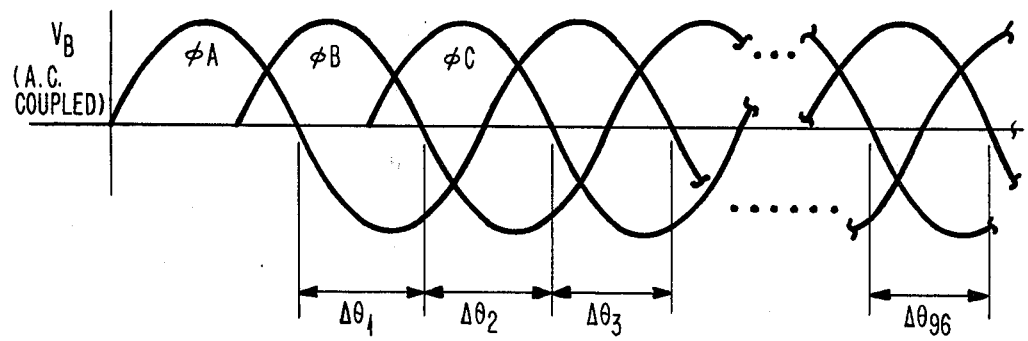

As with torque, the back EMF signals (one for each phase) are spaced 120 electrical degrees apart. The tester is designed to measure the time between back EMF zero crossing from phase to phase around the motor. Thus as shown in FIG. 11, the zero crossing to zero crossing time is illustrated as $\Delta\theta_1$, $\Delta\theta_2$ and $\Delta\theta_3$. Knowing that the motor is to be turned at a fixed velocity, the step length may then be compared against a known step length or a perfect step as a determination of step accuracy. Inasmuch as one complete back EMF cycle contains both positive slope (unstable detent) as well as negative slope (stable detent) zero crossings, stable detents are the preferred measurement points (as shown in FIG. 11) inasmuch as the stable detents are the actual stopping positions of the motor 10. While the waveforms illustrated in FIG. 10 show the measurement of $\Delta\theta$ in units of time, the constant speed of rotation makes this a valid measure of distance as well. Each distance is the actual amount of movement that would be observed if the motor 10 were commutated by full stepping one phase on. Full stepping two phases on would produce a similar $\Delta\theta$ value which too, may be tested for step accuracy by summing to obtain the signals $V_{bAB}$, $V_{bBC}$, and $V_{bCA}$ (see Equation 19 for definition of "$V_b$"). In either instance, the tester measures the time between cross-overs for one complete revolution (in the illustrated instance 96 steps) of the motor 10. The largest and smallest values, $\Delta\theta_{max}$ and $\Delta\theta_{min}$ are saved. The nominal step time is determined as follows:

$$\Delta\theta_{nom} = \frac{1}{\bar{\theta}} = \frac{1}{300 \frac{\text{steps}}{\text{sec}}} = 3.333 \text{ ms/step} \quad (5)$$
$$(\bar{\theta} = \text{Average steps/sec.})$$

Stepping error in percentage step units is expressed as $$\Delta\theta_{1\epsilon} = \frac{\Delta\theta_{1max} - \Delta\theta_{1min}}{\Delta\theta_{nom}} \times 100 \quad (6)$$

for one phase on data, and $$\Delta\theta_{2\epsilon} = \frac{\Delta\theta_{2max} - \Delta\theta_{2min}}{\Delta\theta_{nom}} \times 100 \quad (7)$$

for two phases on.

Equations (6) and (7) are complete expressions. The tester, however, excludes the multiplication constants when making comparisons to the motor parameters. This is done because the data reduction involved in these equations is handled by microprocessor or microcomputer 200. The time required to implement multiplication and division as required in equations (6) and (7) in a mirco-computer only serves to slow down the total test procedure. Thus, equations (6A) and (7A) are employed as follows:

$$K\Delta\theta_{1\epsilon} = \Delta\theta_{1max} - \Delta\theta_{1min} \quad (6A)$$

$$K\Delta\theta_{2\epsilon} = \Delta\theta_{2max} - \Delta\theta_{2min} \quad (7A)$$

where $K = (\Delta\theta_{nom}/100)$ are the test parameters.

By having both 1 and 2 phase signals available, the time $\Delta\theta$ for half stepping may also be determined. For this test, and as an example, the time from each phase crossing to the next second phase crossing is measured ($\Delta\theta_{1-2}$). In this manner an indication of the hysteretic losses in the motor may be determined. The average of $\Delta\theta_{1-2max}$ and $\Delta\theta_{1-2min}$ represents the average length of a half step if commuting the first phase on and then two phases on. The error between this value and the nominal half step length appears to vary with current. This quantity in units of percentage of a step may be expressed as in equation (8) as follows:

$$\Delta\theta_{1-2av} = \frac{\Delta\theta_{1-2max} + \Delta\theta_{1-2min} - \Delta\theta_{nom}}{2} \times \frac{100}{\Delta\theta_{nom}} \quad (8)$$

at 600 ma, and the slope of the $\Delta\theta_{1-2av}$ vs. the i (current) curve, $$\left.\frac{d\Delta\theta_{1-2av}}{di}\right|_{0.6A} = \frac{\Delta\theta_{1-2av}(.75A) - \Delta\theta_{1-2av}(.45A)}{0.3A} \quad (9)$$

also at 600 ma, are all that is required to give an indication as to the degree of hysteretic losses present. In the tester, the two values are combined into a single quantity which estimates the current, $i_o$, necessary to reduce $\Delta\theta_{1-2av}$ to zero. By a simple straight line approximation, $$i_o = 0.6 - \frac{[\Delta\theta_{1-2av}(.6A)]}{\left.\frac{d\Delta\theta^{1-2av}}{di}\right|_{0.6A}} \quad (10)$$

Substituting equations (8) and (9) into equation (10), eliminating unnecessary multiplications, and scaling for appropriate resolution yields equation (11)

$$\frac{(i_o - .6)1000}{.3A} = \frac{1000[\Delta\theta_{1-2av}(.6A)]}{[\Delta\theta_{1-2av}(.45A) - \Delta\theta_{1-2av}(.75A)]} \quad (11)$$

The expression in equation (11) is employed when making comparisons to motor specifications. While the equation looks complex, the data reduction involved in these equations is handled by the microprocessor 200 (more fully described hereinafter) illustrated schematically in FIG. 3. The time required to implement multiplication and division would only serve to slow down the total test procedure, and scaling, in the present instance may be preferrable when floating point arithmetic is not available in the microprocessor.

Running Torque

Equally important to the proper function of a stepping motor is its torque. Running torque is an excellent measure of the usable work that may be accomplished by the motor. Due to the sinusoidal nature of the torque curve produced by each phase of the motor, it makes sense that the maximum amount of torque (running torque) will be produced if each phase were turned on at unstable detent and off at stable detent in sequence around the motor; thus all negative torque regions are avoided. Typically torque may be obtained through equation (12)-(21) below.

$$W_{max/cycle/\phi} = \int_{\theta_{unstable}}^{\theta_{stable}} \int_0^i \frac{\partial\lambda}{\partial\theta} \, di \, d\theta \quad (12)$$

It may be seen that the maximum work per phase, per torque cycle is equal to a double integration of flux linkage.

Through equations (3) and (4), the connection to back EMF is made. By substituting $K_e$ for $\partial\lambda/\partial\theta$, the following equation may be derived:

$$W_{max/cycle/\phi} = \int_{\theta_{unstable}}^{\theta_{stable}} \int_0^i K_e \, di \, d\theta \quad (13)$$

and since velocity is held constant, equation (14) may be also derived $$W_{max/cycle/\phi} = \frac{1}{\dot{\theta}} \int_{\theta_{unstable}}^{\theta_{stable}} \int_0^i V_{B\phi} di \, d\theta \quad (14)$$

Subscript $\phi$ is added as a reminder that $V_B$ is the back EMF of a single phase.

In order to simplify the testing procedure, the order of integration is reversed and carried out as follows. Velocity is held constant as heretofore set forth, and therefore:

$$\frac{1}{\dot{\theta}} \int_{\theta_{unstable}}^{\theta_{stable}} V_{B\phi} d\theta = \int_{t_u}^{t_s} V_{B\phi} dt \quad (15)$$

Rather than integrating with position, the first integration is done with time. To implement this, the back EMF from each phase is full wave rectified (see FIG. 3), and then averaged such that equation (16) results.

$$\int_{t_u}^{t_s} V_{B\phi} dt = \overline{V}_{B\phi}(t_s - t_u) \quad (16)$$

In equation 16, $t_s$ equals the time of stable detent crossing while $t_u$ indicates the time of unstable detent crossing. Accordingly, $t_s - t_u$ is the time of one half a cycle. The integration between $t_u$ and $t_s$ is for a half cycle. This type of integration is permissable because of the symmetry of the back EMF wave form. Because it is difficult to single out any one particular one half cycle to integrate in this fashion, averaging is continuously performed by an RC averaging circuit as the motor rotates. The average value for each phase ($\overline{V}_{BA}$, $\overline{V}_{BB}$, and $\overline{V}_{BC}$) is measured and retained. A measure of $t_s - t_u$ may be obtained by considering the speed of rotation.

$$t_{u1} - t_u = \frac{3 \text{ steps}}{\text{cycle}} \times \frac{1}{\dot{\theta} \frac{\text{steps}}{\text{sec}}}$$

is the time period of an entire cycle. (Note that $t_{u1} - t_u$ = the time for a full cycle.) Thus equation (17) sets forth:

$$t_s - t_u = \frac{1}{2} \times \frac{3 \text{ steps}}{\text{cycle}} \times \frac{1}{\dot{\theta} \frac{\text{steps}}{\text{sec}}} \quad (17)$$

which is the time for one half of a cycle.

The second integration (with current) is handled by simply taking the average value above in equation (17) at several currents (up to the nominal value of current) and adding them together in such a way as to approximate the integration with current.

The work under a curve maximum per cycle per each phase is expressed in equation (18) where $$N = \frac{i_{nom}}{\Delta i}.$$

$$W_{max/cyc/\phi} = \int_0^{i_{nom}} \overline{V}_{B\phi}(t_s - t_u) di \approx \quad (18)$$

$$\Delta i(t_s - t_u)\left[\left(\sum_{n=1}^{N-1} \overline{V}_{B\phi}(n)\right) + \tfrac{1}{2}\overline{V}_{B\phi}(N)\right]$$

The input range of the microprocessor, (depending upon microprocessor selection) without other special circuitry, may vary, but is generally plus or minus ten volts. A scale factor may be applied at the front end differential amplifiers (see FIG. 3 block diagram), as shown in equation (19).

$$\overline{V}_{b\phi} = K_{ac}\overline{V}_{B\phi} \quad (19)$$

Applying equation (19) to equation (18) results in equation (20).

$$W_{max/cyc/\phi} = \Delta i(t_s - t_u)\frac{1}{K_{ac}}\left[\left(\sum_{n=1}^{N-1} \overline{V}_{b\phi}(n)\right) + \tfrac{1}{2}\overline{V}_{b\phi}(N)\right] \quad (20)$$

As may be noted, equation (20) sets forth the maximum possible work output of one torque cycle. A measure of motor running torque is, however, the desired quantity to be compared. Torque may appropriately be expressed as the work done per unit of rotor displacement. Taking radians as this measure of displacement, running torque may be expressed as set forth in equation (21).

$$\overline{T}_{R\phi} = \frac{W_{max/cyc/\phi} \times N_{cyc/rev} \times N_\phi}{2\pi \text{ rad/rev}} \quad (21)$$

In equation (21) $N_{cyc/rev}$ is the number of cycles per revolution, and $N_\phi$ is the number of motor phases. Subscript $\phi$ (where is $\phi$=A, B, or C phases) indicates which phase was used to make this prediction of running torque. Knowing from equation (17) that $t_s - t_u = (3/2\theta)$ and $N_{cyc/rev} = 32$ for this type of motor and $N_\phi = 3$, from equations (20) and (21), equation (22) may be set forth as below.

$$\overline{T}_{R\phi} = \frac{22.92 \Delta i}{\theta K_{ac}} \left[ \left( \sum_{n=1}^{N-1} \overline{V}_{b\phi}(n) \right) + \tfrac{1}{2} \overline{V}_{b\phi}(N) \right] \quad (22)$$

For a 750 ma motor the following parameters may be employed:
N=5 (all five currents listed in the Section of this specification entitled "Torque-Back EMF Relationship")
$\Delta i$ = 150 ma
$\theta$ = 300 steps/sec
$K_{ac}$ = 5/4
$\overline{T}_{R\phi}$ units are mMm (milli Newton meters)

Equation (22) is satisfied from measured data from any one phase. However, the most accurate representation of actual motor running torque, inasmuch as all phases are contributing if the motor is commutated, may be set forth as in equation (23).

$$\overline{T}_R = \frac{\overline{T}_{RA} + \overline{T}_{RB} + \overline{T}_{RC}}{3} \quad (23)$$

If the phases could be commutated such that each were turned on exactly at unstable detent and off at precisely stable detent, this measure of $\overline{T}_R$ would be the maximum possible running torque produced by the motor. It is noteworthy that this value is approximately equal to the peak holding torque of the motors.

The tester employed to carry out the method of the present invention excludes multiplication constants when making comparisons to the motor specification as done for the step error measurements. Thus, the actual calculated quantities by the microprocessor 200 would utilize the equation set forth below in equation (24) and equation (25).

$$\overline{CT}_{R\phi} = \left( \sum_{n=1}^{N-1} \overline{V}_{b\phi}(n) \right) + \tfrac{1}{2} \overline{V}_{b\phi}(N) \quad (24)$$

where $C = \frac{\theta K_{ac}}{22.92 \Delta i}$ and $$\frac{\overline{CT}_R}{10} = (\overline{CT}_{RA} + \overline{CT}_{RB} + \overline{CT}_{RC})/30 \quad (25)$$

These are the calculated quantities. The test parameters $\overline{CT}_{R/10}$ and $10 \Delta \overline{T}_{R\phi} = 100$ times the maximum minus the minimum of the $\overline{CT}_{R\phi}$ values, divided by $\overline{CT}_{R/10}$ must fall within specified or predetermined limits. The quantity $\Delta \overline{T}_{R\phi}$ is a measure of phase to phase variations in the motor in percentage of average running torque $\overline{T}_R$.

It should be noted, and as mentioned heretofore, all phases are energized simultaneously during the testing operation. The assumption is that mutual coupling between phases is negligible. In other words, each phase acts as if it were the only phase energized. This assumption has proved to be a valid one.

Variation in the Motor

Variations in the peak voltages of the back EMF signal may be expected during rotation of the motor and normally pose no problem. However, if the motor exhibits large variations in back EMF signals, this may be an indication of a faulty motor. The variations which are possible and which will be discussed together below are phase to phase variations ($\Delta \overline{T}_{R\phi}$) and variations within a single phase around the motor. The following test will determine if unacceptable variation does exist in the motor.

The peak back EMF voltage levels of every phase are sampled over a revolution and the maximum value ($V_{Pmax}$) and minimum value ($V_{Pmin}$) (see block diagram FIG. 3) are determined. It should be noted that these values are not selected per phase, but rather represent the single largest peak and single smallest peak of all phases per revolution. The difference of $V_{Pmax}$ and $V_{Pmin}$ ($\Delta V_P$) represents the maximum variation measured in the motor due to both phase-to-phase variation and individual phase variation per revolution.

The phase-to-phase variation was considered in the above section entitled "Running Torque". This is expressed as a percentage of average torque. To separate this effect from effects due to rotor variations in the motor, the variation in peak back EMF, $\Delta V_P$, is first expressed as a percentage of average of all the back EMF peaks. This average of all the peaks could have been generated by filtering the output of the peak detect and hold circuit in a manner similar to the technique used to generate average back EMF, $\overline{V}_b$. But because $\overline{V}_b$ exists already and the peak back EMF is approximately 1.5 times $\overline{V}_b$, the following expression in equation (26) is employed to find the (/REV) variable.

$$(/REV) = 100 \left[ \frac{(\Delta V_p)}{(1.5 \overline{V}_b)} \right] - \Delta \overline{T}_{R\phi} \quad (26)$$

The (/REV) variable is express in equation (26) as a percent of average. Again, for microprocessor scaling to avoid floating point arithmetic problems, equation (27) may be employed.

$$10(/REV) = 1000 \left[ \frac{\Delta V_P}{1.5 \overline{V}_b} \right] - 10 \Delta \overline{T}_{R\phi} \quad (27)$$

Equation (27) is used when making comparisons to predetermined motor parameters and is carried out by the microprocessor 200. Note that $10\Delta\overline{T}_{R\phi}$ is the form previously used in microprocessor phase-to-phase comparisons and that effect is corrected off of the (/REV) calculation. The peak measurements ($V_{pmin}$ and $V_{pmax}$) are made at 600 ma and each measurement is made five times and averaged to reduce noise effects.

Damping Potential

Damping ratio is a measure of the rate of amplitude reduction of the oscillations of a step motor around its detent position. With certain stepping motors, it is desirable to electronically increase their damping ratio and thus reduce oscillations more quickly. Such applications as printwheel character selection where large oscillations at the end of a move are detrimental to performance makes it desirable to quickly reduce these oscillations. Reducing the oscillations increases the printer throughput rate when a machine is in the playback mode. In the playback mode, the typewriter or printer attempts to print without stopping the carrier, but if the time required to select a print character is excessive, the carrier is forced to stop which reduces the character throughput of the machine. A damping driver therefore can reduce these oscillations by changing the reference voltage waveform in a chopper driver sense circuit. Accordingly, damping potential is a significant characteristic of a motor which must be determined to permit proper design of the damping driver, if in fact one is required. In this connection, if the sample motor 10 is driven in the damp mode at 600 ma, the testing of the motor's capability to damp efficiently should also be accomplished at this level. A minimum amount of back EMF is necessary to achieve proper damping of the motor. The average back EMF, $\overline{V}_b$ is set forth in equation (28) as follows:

$$\overline{V}_b = \frac{\overline{V}_{bA} + \overline{V}_{bB} + \overline{V}_{bC}}{3} \bigg|_{600 \text{ ma}} \quad (28)$$

The average back EMF $\overline{V}_b$ is a predictor of the motor's average damping potential. (Measured test parameter is $3\overline{V}_b = \overline{V}_{bA} + \overline{V}_{bB} + \overline{V}_{bC}$. It should be noted from equation (19) that $\overline{V}_b = K_{ac}\overline{V}_B$.)

Rotor Stator Gap Width

The gap between the teeth 13 of the rotor 12 and the teeth 14 of the stator 11 of a motor 10 is directly related to the torque produced by the motor. In essence, the smaller the gap, the larger the torque. Back EMF conventionally increases with current up to a certain predetermined point and then decreases. This point is sometimes called the saturation point and is known to occur at different currents for different motors. The phenomenon may be explained as result of several different motor design parameters, for example different materials or different manufacturing processes. However, on the basis of experimental data, the width of the air gap has been shown to have a very measurable effect on the location of the saturation point. Typically, with example motors of the type described, the saturation point is reached somewhere between 450 and 600 ma. The derivative of the $V_B$ versus i curve at the same current for every motor tested will give a slope which indicates the location of the saturation point. An excellent approximation of this may be obtained with the five $\overline{V}_{b\phi}$ values taken for each phase of the motor 10. The slope of the curve at 600 ma may be approximated as shown in equation (29).

$$\frac{d\overline{V}_b}{di}\bigg|_{0.6A} = \frac{\overline{V}_b(0.75A) - \overline{V}_b(0.45A)}{0.3A} \quad (29)$$

A value of 0 indicates saturation occurred at 600 ma. While a negative slope indicates saturation occurred at a current less than 600 ma. The steeper the slope, the smaller the current required to produce the flux necessary to saturate the iron core. A positive slope implies saturation at a current beyond 600 ma. Thus, a larger current is needed to saturate the iron due to a wider gap between the rotor 12 and the stator 11. This analysis has produced very consistent results.

By excluding division from the data reduction of equation (29), the measured test parameter is as set forth in equation (30).

$$0.3 \frac{d\overline{V}_b}{di} = \overline{V}_b(0.75A) - \overline{V}_b(0.45A) \quad (30)$$

Short Detection

During the manufacture of a motor such as the motor 10, it is possible that motor coils may be shorted (partially or completely) or alternatively open. This is checked once before grinding the rotor and stator teeth 13 and 14 respectively, but is checked again with the method of the present invention by a simple measure of $V_{sup}$. This parameter, or characteristic $V_{sup}$ is defined to be the voltage across all of the coils. The coils 1a–6a, as noted before, are placed in series. Inasmuch as the back EMF signals are 120 electrical degrees apart, the only voltages that should be present in a good motor being tested, in accordance with the method of the present invention, is a small ripple riding on the DC (iR) drop of the coils. For the individual tests of each of the coils, the DC component is removed (AC coupling). Therefore measurement of the average value of the supply voltage, $\overline{V}_{sup}$, is adequate for this resistance test. Knowing the approximate resistance of a phase, one would expect the DC portion of $V_{sup}$ to be approximately $3 \times R_\phi \times i = V_{DC}$, where $R_\phi$ = the resistance of a coil. A short in the coils drops the DC portion on which the ripple is riding. An open circuit, on the other hand yields no signal at all since there would be no current flow. In the example motor 10, this test may be conducted at a nominal current of approximately 750 ma.

A scale factor, $K_{sup}$, is applied for the measurement of $V_{sup}$. It is noted that a three-phase motor possessing different voltage levels may easily be adapted by merely changing the gain of the AC coupled differential amplifiers (see FIG. 3) which will be more fully discussed hereinafter. Either digital averaging or an analog averaging circuit may be employed to obtain $\overline{V}_{sup}$. Analog averaging has been used successfully, and digital averaging is employed in the preferred embodiment of the tester which is illustrated in block form in FIG. 3.

Figure 12A:
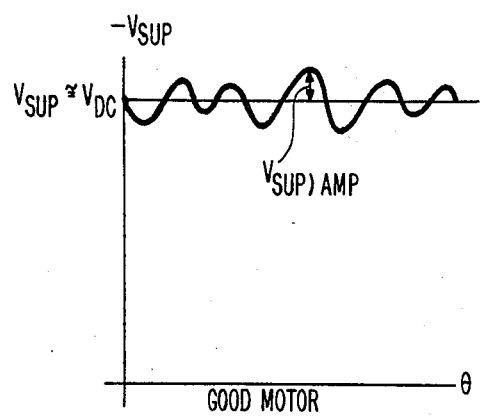
Figure 12B:
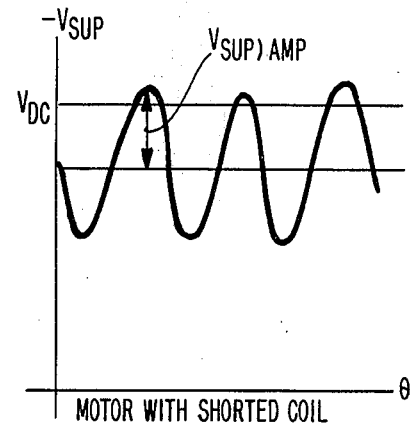

FIGS. 12a and 12b illustrate respectively the waveform exhibited by a good motor and one with a shorted coil. In the drawing figures, rotational position $\theta$ is on the abcissa and $V_{sup}$ which approximates $V_{DC}$ is on the ordinate. Note that $V_{sup)amp}$ is the amplitude of the supply voltage ripple when current is held constant. It should be noted that $V_{sup)amp}$ is larger when a shorted winding is found, and offset from the normal voltage supply level ($V_{DC}$) which clearly indicates a shorted winding.

Harmonic Content

The variable $V_{sup)amp}$, the amplitude of the supply voltage ripple when current is held constant, is an indicator of a partial phase short as discussed above, but it is also an indicator of a change in the shape or harmonic content of the individual phase back EMF curves of the motor.

As previously described, each phase of a three-phase motor is 120 electrical degrees apart (based upon the fundamental frequency). If each phase back EMF, $\overline{V}_{b\phi}$, is represented by a Fourier series, and assuming only dominant sine terms for a three-phase motor, equation (31) results:

$$V_{bj} = \sum_{n=1}^{\infty} A_{nj}\sin\left[n\left(\frac{2\pi}{3} + \phi_j\right)\right] \tag{31}$$

This is where $\Phi_j = 0$, $(2\pi/3)$, $(4\pi/3)$ radians

Summing the back EMF resulting from all three phases in series yields equation (32) as follows:

$$V_{btotal} = \sum_{n=1}^{\infty} A_{n1}\sin\left(\frac{2\pi n\theta}{3}\right) + A_{n2}\sin\left(\frac{2\pi n\theta}{3} + \frac{2\pi n}{3}\right) + A_{n3}\sin\left(\frac{2\pi n\theta}{3} + \frac{4\pi n}{3}\right) \tag{32}$$

If the fundamental frequency is the only frequency component present in each phase (n=1) and the amplitude of all phases were identical ($A_{11} = A_{12} = A_{13}$) then equation (33) results:

$$V_{btotal} = A_{11}\left[\sin\frac{2\pi\theta}{3} + \sin\left(\frac{2\pi\theta}{3} + \frac{(2\pi)}{3}\right) + \sin\left(\frac{2\pi\theta}{3} + \frac{4\pi}{3}\right)\right] \tag{33}$$

which is identically zero as can be seen by employing trigonometric identities.

If motor structure is altered, for example the tooth shape, the back EMF curves are distorted from a sine wave and the third harmonic (n=3) increases most predominantly. Equation (32) with n=1,3 and third harmonic amplitudes equal ($A_{31} = A_{32} = A_{33}$) then becomes equation (34) as follows:

$$V_{btotal} = A_{31}\left[\sin\frac{2\pi 3\theta}{3} + \tag{34}\right.$$

-continued $$\left.\sin\left(\frac{2\pi 3\theta}{3} + \frac{2\pi 3}{3}\right) + \sin\left(\frac{2\pi 3\theta}{3} + \frac{4\pi 3}{3}\right)\right]$$

It should be noted that the n=1 contribution is zero as before. For a motor with a fundamental (n=1) and a third harmonic (n=3) present the phase shifts of $2\pi$ and $4\pi$ radians results in equation (35) as follows (the phases add):

$$V_{btotal} = A_{31}3\sin 2\pi\theta \tag{35}$$

It should be noted that the same $V_{sup}$ signal which is digitally averaged to find resistance may also be analyzed with microprocessor code in the microprocessor 200 for maximum and minimum ripple.

Average Inductance

A common motor problem relating to low torque is commonly "fixed" by increasing the number of laminates in the motor. However, adding laminates increases inductance thus causing undesirable driver performance which reduces the torque available at high speeds. Typically, inductance is a difficult measurement to obtain even using a classical inductance bridge, but an average inductance indicator is readily available during the current source turn-on sequence. During the rise of current from zero to the required value (nominal for the average inductance test), the equation describing the current transient is set forth in equation (36).

$$3L_{av}\frac{di}{dt} = E_{sup} - 3R_{av}i - V_{btotal} \tag{36}$$

The terms $(3L_{av})$ and $(3R_{av})$ are present because all three phases are in series. Additionally, because the motor is rotating, $V_{btotal}$ is approximately zero. Because the current regulation has not commenced, $E_{sup}$ is a known constant power supply voltage. With these observations, equation (36) may be solved for current as a function of time and inductance. This equation is set forth in equation (37) as follows:

$$i = \frac{E_{sup}}{3R_{av}}(1 - e^{-t/\tau}) \tag{37}$$

In equation (37), $\tau = L_{av}/R_{av}$.

By monitoring the current during this transistion, the time $t)_L$, is measured when the current reaches a trigger level, $i)_{trig}$. The average resistance is measured as described above. Thus average inductance is found by rearranging equation (37) as equation (38) as follows:

$$L_{av} = \frac{R_{av}t)_L}{\ln\left(\frac{E_{sup}}{E_{sup} - 3R_{av}i)_{trig}}\right)} \tag{38}$$

This calculation is too complex for reasonable microprocessor use so $t)_L$ is used within the processor 200 for comparison against standard motor specifications. In the example motor given, a 670 mv Zener diode (not shown) is used to provide a reference voltage to compare against the voltage across a one ohm current sense resistor. Thus, $i)_{trig} = 670$ ma. It should be noted $L_{av}$ is averaged over $0 \leq i \leq i)_{trig}$ and also over all positions because the motor is rotating.

SUMMARY OF THE TEST PARAMETERS

A summary of the test parameters is set forth in tabular form below. Each of these tester parameters and its comparable "Motor Parameter" is set forth under the appropriate columns. The column labeled "Typical Motor Specifications" contains the nominal values from an acceptable sample motor of the type described.

| Tester Parameters | Motor Parameter | Typical Motor Specifications |
|---|---|---|
| $\bar{v}_L$ | Average Inductance | 66 mH |
| $K\Delta\theta_{1\epsilon}$ | Stept Error (One Phase) | 1% |
| $K\Delta\theta_{2\epsilon}$ | Step Error (Two Phase) | 3.4% |
| $(i_{c}.6) \times 1000/.3$ | Hysteretic Losses | $(i_o) = 700$ ma |
| $CT_R/10$ | Running Torque | $(T_R) = 167$ mNm |
| $10\Delta T_{R\phi}$ | Phase-to-Phase Variation | $(\Delta T_{R\phi}) = 1.9\%$ |
| 10 (/REV) | Back EMF Variation per Revolution | (/REV) = 3.4% |
| $3\bar{V}_b$ | Damping Potential | $(\bar{V}_b) = 3.8$ |
| $\bar{V}_b(.75A) - \bar{V}_b(.45A)$ | Gap Width | .041 mm |
| $K_{sup} \cdot \bar{V}_{sup)amp}$ | Short Detection and Harmonic Content | |
| $K_{sup} \bar{V}_{sup}$ | Resistance | 5.4 ohms/Phase |

Tester Implementation

In order to effect uniform rotation of the rotor 12 of the motor 10, shaft rotating means 20 are provided. While any convenient means may be employed for coupling the shaft 12a of the rotor 12, it is preferrable that a means be provided for quickly coupling and releasing the shaft 12a to a shaft 21a of the driving motor 21. To this end, the shaft and rotating means 20 includes a trunion mounted air cylinder 22 which is coupled to a yoke-arm 23 to move an activating ring 24 away from a toggle release arm 25 and pass over the cam surface 26a of the toggle linkage 26. This forces a center pivot point 26b of the toggle linkage 26 to pass over center and rest against the sliding member 27. This locks the shaft 12a against the collar-like sliding member 27.

The clamping force on the shaft 12a is created by the toggle linkage 26 (a minimum of three equally spaced around the coupling), forcing the collar-like sliding member 27 away from the support member 28 and causing the sliding member 27 inside conical surface to wedge over the outside conical surface of the shaft clamping collet 29.

Activating the trunion mounted air cylinder 1 in the opposite direction from clamping causes the yoke arm 23 to move the activating ring 24 against a toggle release arm 25 which forces the toggle linkage 26 away from the sliding member 27, thereby releasing the clamping force on the shaft 12a of the motor 10.

The clamping force may be adjusted by turning an adjusting nut 30 to provide the desired clamping force. The adjustment is locked at the desired level by tightening the locking member 31 against the adjusting nut 30, creating a jam lock condition.

The activating ring 24 is guided and held concentric to the coupling by a fixed bearing assembly 32. This allows the coupling to turn freely within the activating ring 24 without contact or friction when clamped to the shaft 13.

As illustrated in FIG. 2, the coupling may be permanently attached to the motor shaft 21a of the driving motor 21 as by set screws 33, or with any other convenient manner as by pinning, split collar, clamping, etc.

Constant Current Source

A constant current source is a necessary requirement for practicing the method of the present invention. All parameters to be measured in the tester are totally dependent on the premise that a constant direct current will simultaneously energize each of the step motor phase windings during the test. The example motor employed, notably a multi-phase, variable reluctance step motor 10 is tested in a dynamic mode such that the motor during test appears as an active AC generator. That is, when the step motor phases $\phi A - \phi C$ are energized with a direct current and the motor shaft 12a is driven by a constant velocity motor 21, back EMF signals will appear on each phase winding $\phi A - \phi C$ as voltages which vary with time, dependent upon the motor characteristics.

The current source for this application must exhibit stability and respond to these signal voltage variations as it maintains the desired direct current magnitude in the load.

Figure 9:
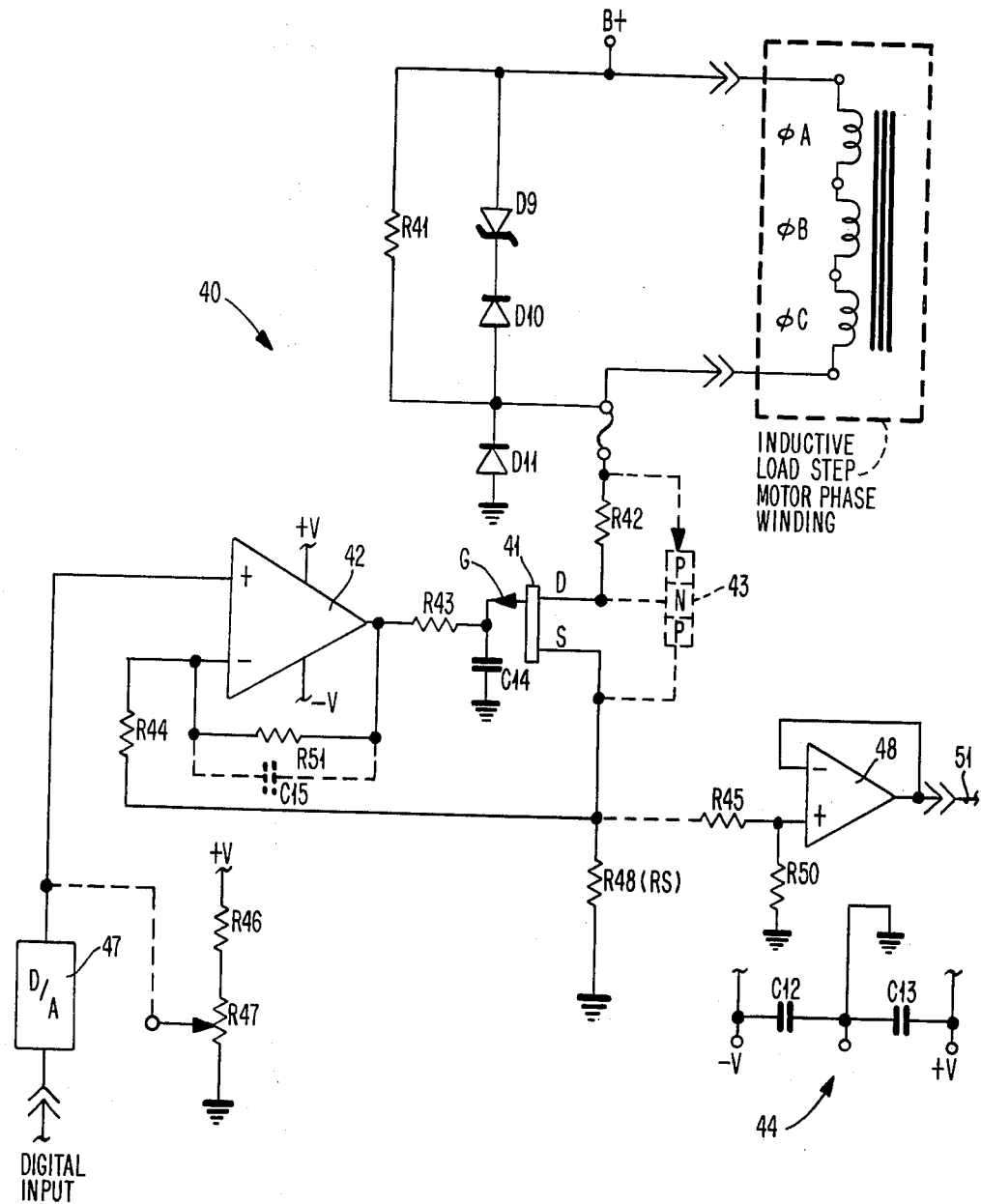
FIG. 9 is a controlled or constant current source schematic diagram useful with the block diagram circuitry illustrated in FIG. 3.

Turning now to the drawing, and especially FIG. 9 thereof, a controlled or constant current source 40 is illustrated therein. An FET amplifier 41 is controlled by an operational amplifier 42. The circuit illustrated uses the operational amplifier 42 and associated feedback as through resistor R51 and associated capacitor C15 to maintain the desired current at DC and low frequencies. This circuit takes advantage of the high drain impedance of the FET 41 to maintain the desired current at high frequencies. A sample of the load variation across R48 (which is the sense resistor, and may be referred to hereinafter as RS) allows the operational amplifier 42 to gate the FET and vary the circuit impedance to maintain a constant current in the load, in the present instance the series connected phases $\phi A - \phi C$ of the motor 10.

The controlling current magnitude is established by a control voltage reference. The control voltage reference may be either operator controlled, as through a potentiometer R47 connected to a source of voltage $+V$, through resistor R46; or programmed with digital control through a digital to analog (D/A) convertor 47 as illustrated in the drawings. Inasmuch as a microprocessor is available (microprocessor 200 in FIG. 3), the control voltage reference may be applied digitally by the microprocessor 200.

The overall controlled source stability is maintained by the operational amplifier 42 gain and frequency compensation. The circuit may have its gain set as low as 10. Networks in the operational amplifier 42 feedback loop comprising R44, R51 and possibly C15 will provide frequency compensation. The gain and frequency compensation in the circuits have been selected to work with the variables of the particular motor being tested.

The active load which the phases of the motor place on the current source has a fundamental signal frequency of 100 Hz (3 steps per back EMF cycle, and since the tests for the sample motor are conducted at 300 steps per second, 300/3=100) plus its higher harmonics. The magnitude of these AC signals will vary as the motor quality varies.

For test requirements that utilize programmed digital control to rapidly change discrete current levels in the load, the operational amplifier 42 must be adjusted with minimal frequency compensation. A circuit illustrated with C15 therein utilizes RC frequency compensation. Without the capacitor C15, current values may change from zero to maximum (in the illustrated instance 750 ma) and return to its zero in 15 ms.

If desired, an inexpensive FET may replace a larger one by adding a bipolar transistor 43 shown in dotted lines in FIG. 9. In this configuration, the FET 41 then may comprise a small signal control field effect transistor in which the drain is connected to the base of the bipolar transistor to control current flow and maintain current flow constant through the phases $\phi A$-$\phi C$ during test.

The operational amplifier 42 has its own power supply 44 which includes filter capacitors C12 and C13 to apply, for example, plus or minus V volts (for example 15 volts) to the appropriate terminals of the operational amplifier. The unregulated B+ which is applied to the circuit for control by the field effect transistor 41 may be on the order of 40 volts, by way of example.

As will be seen when discussing the block diagram of FIG. 3, The sense resistor RS, in the present instance resistor R48, at the junction of the feedback loop including resistor R44 to the operational amplifier 42, provides a signal to an amplifier 48 through a divider circuit comprising resistor R45 and R50 to provide an output online 51 to the 670 mv compare 52, illustrated in FIG. 3.

The Circuitry

As has heretofore been stated, the key to the test method of the present invention relies upon the direct relationship between back EMF and torque. Thus, back EMF is utilized as the sought after measurement such that many other parameters of the motor may be derived therefrom. The circuitry illustrated in block diagram form in FIG. 3 permits a derivation of these parameters which characterize the motor. To this end, and referring now to FIG. 3, the current source 40 is connected in series with the series connected windings of the three phases of the motor such that $\phi A$, $\phi B$ and $\phi C$ are series connected to the constant current source 40. Thus, the same current flows through each of the phases of the coils of the motor 10. Because each of the phases ($\phi A$-$\phi C$) are series connected, the back EMF generated across the entire motor is very small and because of such, the current source 40 does not have to "work as hard" because voltage swings or oscillations are maintained at a minimum. In a like manner, because of the series connection of the phases and because of the "bucking" of the series connected motor coils (1a-6a) the overall torque is low. If only one or two phases were connected in series for the test purpose, the amount of torque required by the shaft rotating means would be significantly increased. Thus for test purposes it is advantageous to connect the phases ($\phi A$-$\phi C$) in series as illustrated in FIG. 3.

Also series connected in the circuit of the current source and motor coils or phases is a sense resistor RS (or R48), in the present instance 1 ohm, which was heretofore described in FIG. 9, incorporated in the controlled constant current source 40. The current sense amplifier 48 is depicted in block form in FIG. 3. As heretofore discussed, the output of the sense amplifier 48 is a voltage proportional to current. This voltage is applied as an input to the microprocessor 200 to control the constant current source 40 by way of the digital input (FIG. 9) to the D to A convertor 47. (This line is not shown on the block diagram of FIG. 3 to avoid confusion with the parameters being derived from the back EMF measurements hereinafter described.)

However, the output of the current sense amplifier 48 is applied through line 51 to a 670 mv compare (by way of example only) 52 which is a comparator having its compare voltage established by a Zener diode to force the output to change state when the input line 51 reaches 670 mv. The microprocessor 200 is employed to measure the time difference between the time when the current is first turned on to the time when the comparator changes state. Thus the parameter t)$_L$ represents this value.

In order to accurately measure the supply voltage, $V_{sup}$, a differential amplifier 55 has its inputs directly coupled across the phases $\phi A$-$\phi C$. As illustrated in FIG. 4a, the coupling to the differential amplifier is through resistors R1 and R2, the operational amplifier 55A having a trimmable (as by potentiometer R4) feedback on the negative input leg loop through resistor R3. As is conventional, the positive input leg through resistor R2 to the operational amplifier 55A includes a voltage adjusting potentiometer R5 and fixed resistor R51. The potentiometers R4 and R5 are thus adjusted to obtain the desired gain, $K_{sup}$. Thus the input to the microprocessor 200 is $K_{sup}V_{sup}$. Additionally, for purposes of calibration, the input to the differential amplifier 55 may include a double pole double-throw type switch 56 which allows the remaining circuits and microprocessor to have applied thereto a calibrated source. Upon test operation, the switch 56 is thrown into the position to permit reading across the motor phases $\phi A$-$\phi C$.

In order that true back EMF may be read, (i.e., the direct current component is removed) each of the phases $\phi A$-$\phi C$ is AC coupled through a differential amplifier 60a, 60b, 60c (FIG. 3) which gives as an output signal only the AC component of the back EMf, i.e., the true back EMF. A typical AC coupled differential amplifier 60 useful in the circuit 60a-60c is shown in FIG. 4b. The difference between the two circuits of FIG. 4a and 4b is only that the inputs to the operational amplifiers 60a-60 c include DC blocking capacitors C14 and C15 which couple only the AC signal to the differential amplifiers. The various resistor values and capacitor values may be chosen for the particular motor being tested to allow for any scaling required due to the levels of the inputs.

The outputs of the AC coupled differential amplifiers 60a-c, produce the back EMF of each of the phases designated on the block diagram as $V_{bA}-V_{bC}$. These outputs are fed to full wave rectifiers 70a-70c, the summing amps 90a-90c and as one set of inputs to the zero cross-over detection circuit 140.

Referring first to determining the average back EMF for each of the phases, a typical full wave rectifier 70, illustrated in FIG. 5, includes a pair of operational amplifiers 71 and 72. Each of the operational amplifiers 71 and 72 comprise diode feedback loops including diodes D1 and D3 to make the operational amplifiers 71 and 72 act as perfect diodes. The remainder of the circuitry is conventional, for example resistors R7 and potentiometer R8 form part of a feedback loop for adjustment purposes of the gain of the operational amplifier 71. Operational amplifier 72 is connected as a modified voltage follower and therefore no adjustments by way of feedback and potentiometer is required.

Figure 6:
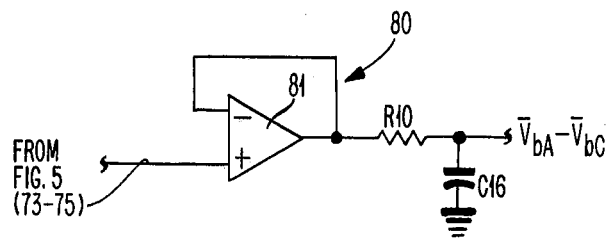
FIG. 6 is a schematic diagram of an averaging circuit which may be employed in the block diagram illustrated in FIG. 3.

As shown, each of the full wave rectifiers provides an output 73, 74 and 75 respectively to averaging circuits 80a-80c (FIG. 3). A typical averaging circuit 80 is illustrated in FIG. 6. The averaging circuit includes a resistor R10 and capacitor C16 to average the ripple from the rectified full wave rectifier. This forms the outputs or the average back EMF $\overline{V}_{bA}-\overline{V}_{bC}$. The operational amplifier 81 of each of the averaging circuits is a high input impedance emitter follower to reduce current draw so that the true average may be obtained with the RC circuit comprising R10 and C16.

Figure 7A:
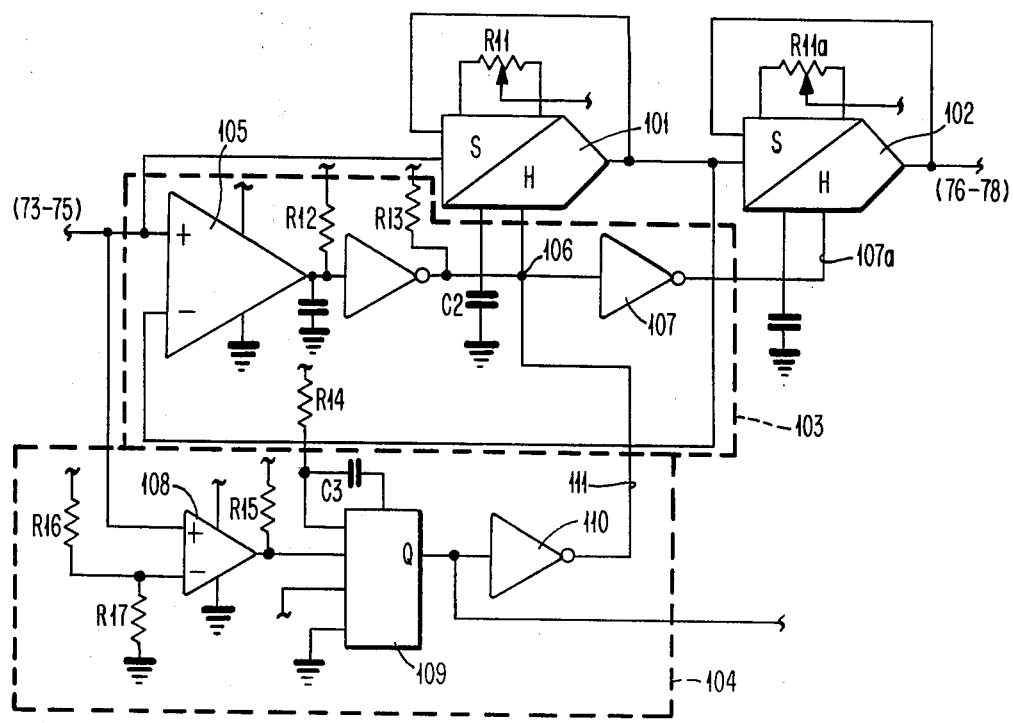
FIGS. 7a and 7b are schematic diagrams of typical amplitude detect and hold circuit which may be employed in the circuit of the block diagram of FIG. 3.
Figure 7B:
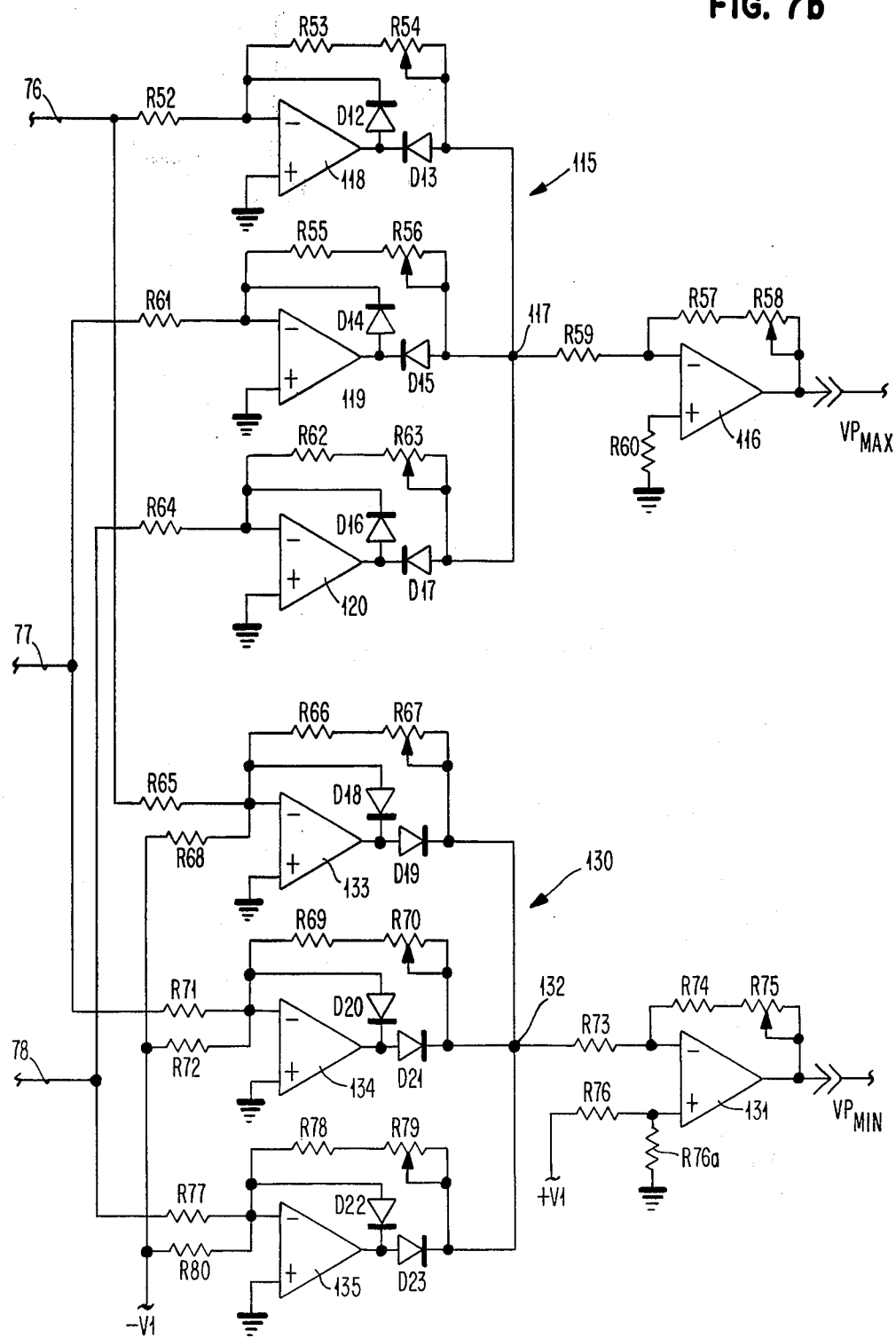

The output from the full wave rectifiers 70a-70c is not only fed to the averaging circuits 80a-80c but is also fed to the circuit, illustrated in FIG. 3 labeled amplitude detect and hold 100. The amplitude detect and hold circuits are depicted schematically in FIGS. 7a and 7b. The circuit of FIG. 7a is replicated three times to take individual inputs from the lines 73, 74 and 75 respectively. Only one of the sample and hold portions of the circuit is illustrated in FIG. 7a, FIG. 7b representing the minimum and maximum peak selection portions of the circuitry for a combination of the outputs of each of the three amplitude detect and hold circuits.

Turning now to FIG. 7a, an exemplary example of an amplitude detect and hold circuit 100 is illustrated therein. As shown, the circuit comprises two sample and hold stages, 101 and 102 (for example Datel Corporations's SHM-IC-1) with appropriate logic to control the tracking and necessary memory capability. The sample and hold circuits 101 and 102 are cascaded and under control of logic circuits 103 and 104 illustrated in dotted lines in FIG. 7a. As the analog signal input from one of the lines 73-75 reaches its peak value, or amplitude value, the input and output of the first stage sample and hold 101 will be of equal value, and logic control 103 will switch rapidly from "sample" to "hold." However, when the analog signal decreases from the crest value, the analog comparator circuit 105 will instantly, because of the signal at the junction 106, set the first stage sample and hold 101 to the "hold" mode. As this hold condition appears at the first stage sample and hold 101, the converse signal (sample condition) appears at the second stage sample and hold 102 because of the logic inverter 107 and its output signal appearing on line 107a. As the analog signal continues to change a valley condition of the wave form is reached and then the waveform begins to rise to a new or different peak amplitude.

Logic signals are generated by the second analog comparator 108 of the valley detect and timer control logic circuit 104. This occurs when the valley of the wave form is detected. This control signal from the comparator 108 is fed to an input of a timer 109 which serves to delay the resetting of the sample and hold circuits 101 and 102. The output of the timer 109 is fed to an inverter 110 which produces an inverted control signal on line 111. The inverted control signal is OR'ed with the first logic signal which appeared at junction 106 by simply shorting the two TTL signals together such that the combined logic control produce the desired output signals.

The output of the sample and hold stage 102 from each one of the three phases is labeled 76-78 in FIG. 7a and is applied to the maximum and minimum peak detector circuits 115, 130 respectively. In reality the peak detector circuits 115 and 130 are instantaneous maximum value reading circuits which detect and read the maximum instantaneous amplitude of the three phases as the rotor 12 is rotated during tests. The output of each of the instantaneous maximum detection circuits 115 and 130 is coupled to a unity gain operational amplifier 116, 131 which acts as a buffer amplifier and an inverter amplifier to inhibit "downstream" loading and to invert the signal at the nodes 117 and 132 respectively. However, it should be noted that the buffer and inverter amplifier 131 operates in a slightly different mode than the buffer and inverter amplifier 116, inasmuch as the buffer and inverter amplifier 131 also serves as a summing amplifier with regard to voltage $+V1$ applied at the positive input of the operational amplifier 131.

The instantaneous maximum detection circuit 115 is comprised of operational amplifiers 118-120 and their associated diode and resistor feedback loops illustrated in FIG. 7B. The diodes D12-D17 associated respectively with the operational amplifiers 118-120 serve as blocking diodes when any one of the phase signals 76-78 is applied to the inputs and is of a lower amplitude than any other. This insures that at the node 117, only the maximum amplitude signal is applied to the negative input of the operational amplifier 116.

The instantaneous minimum detection circuit 130 is operated somewhat more critically than the instantaneous maximum detection circuit 115. As illustrated in FIG. 7b, the outputs of each of the operational amplifiers 133-135 is biased positively by the application of negative voltage V1 to the negative inputs of those operational amplifiers. As shown, this voltage is applied through matched resistors R68, R72 and R80, those resistors matching respectively the corresponding resistors in the input legs, i.e., R65, R71 and R77. All of the resistors R65, R68, R71, R72, R77 and R80 should be selected to be matched within one percent so as to inhibit non-linearities from occurring in the operational amplifiers 133-135. In a like manner, resistors R76 and R76a associated with operational amplifier 131 should also be matched (selected equal to within one percent). Thus in a similar manner to the instantaneous maximum peak detection circuit 115, only the greatest amplitude waveform will appear at node 132.

In the instance of the maximum peak detection circuit 115, the amplitude of the waveform appearing at node 117 is negative, the waveform being inverted by the buffer and operational amplifier 116 to place an output on the output line of $V_{Pmax}$. In the instance of circuit of instantaneous minimum detection circuit 130, however, the amplitude of the waveform is positive at node 132. The application of voltage $+V1$ to the positive input of the operational amplifier 131 serves to bias the output of operational amplifier 131 negatively such that along with the inversion of the signal from node 132 to the output of the operational amplifier an inversion and a summing of the bias condition also occurs. The net effect is to bring the zero or ground level back to the original level. In this connection, and therefore, voltages $-V1$ and $+V1$ must have the same magnitude (although of opposite polarity) to within one percent so that the output $V_{Pmin}$ is a true value.

Figure 8A:
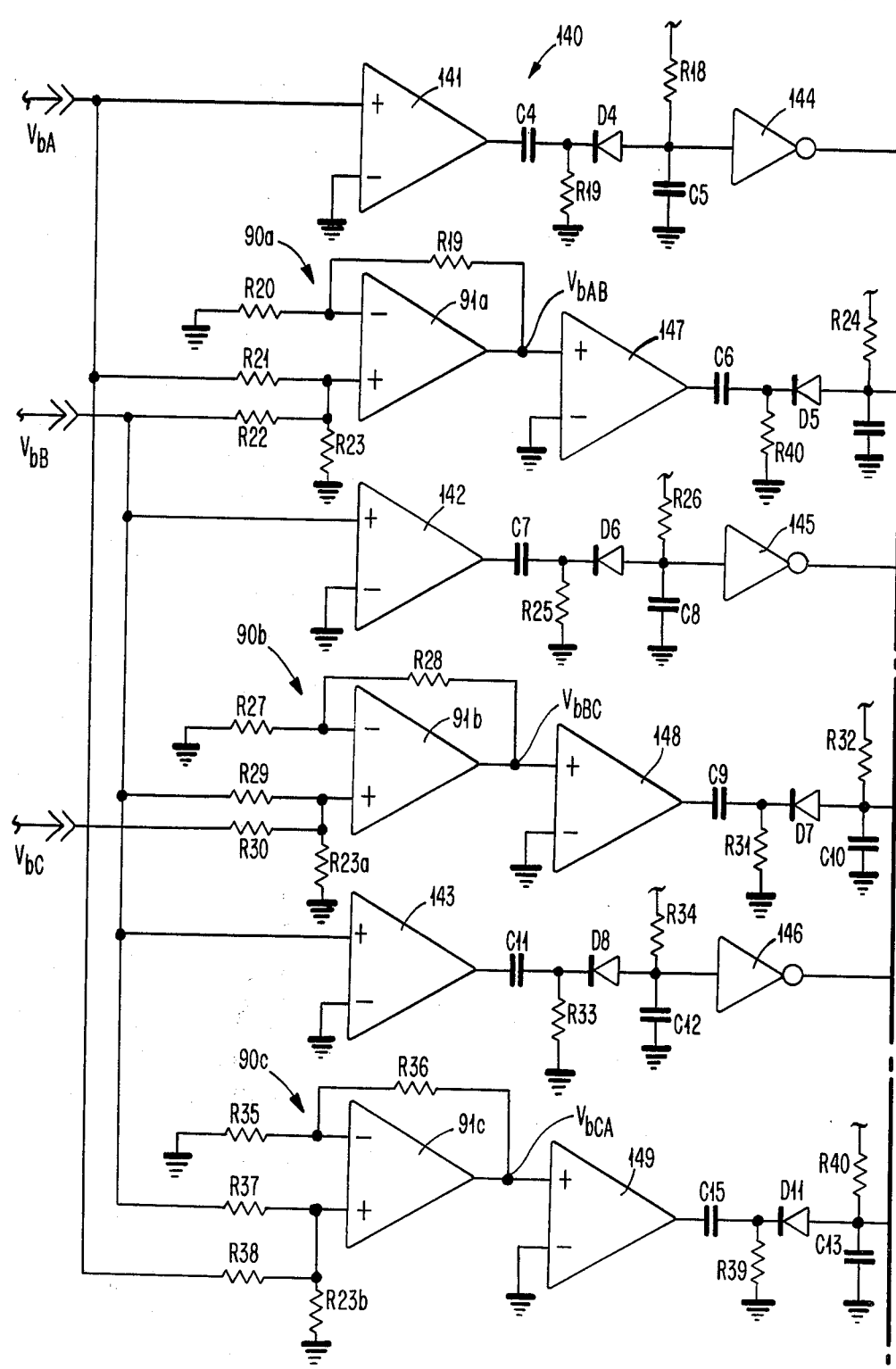
FIGS. 8a and 8b are schematic diagrams of portions of the zero cross-over detection circuit utilized in the circuitry of the block diagram of FIG. 3.

The summing amplifiers or circuits 90a-90c are illustrated in FIG. 8a as included within the zero cross-over detection circuit 140. The summing amplifier circuits comprise operational amplifiers 91a-90c which provide an output which is the summation of two of the phases. As illustrated, at the outputs of each of the amplifiers 91a-91c, the voltage mnemonic given is $V_{bAB}$, $V_{bBC}$ and $V_{bCA}$ which is derived from the inputs $V_{bA}-V_{bC}$.

Figure 8B:
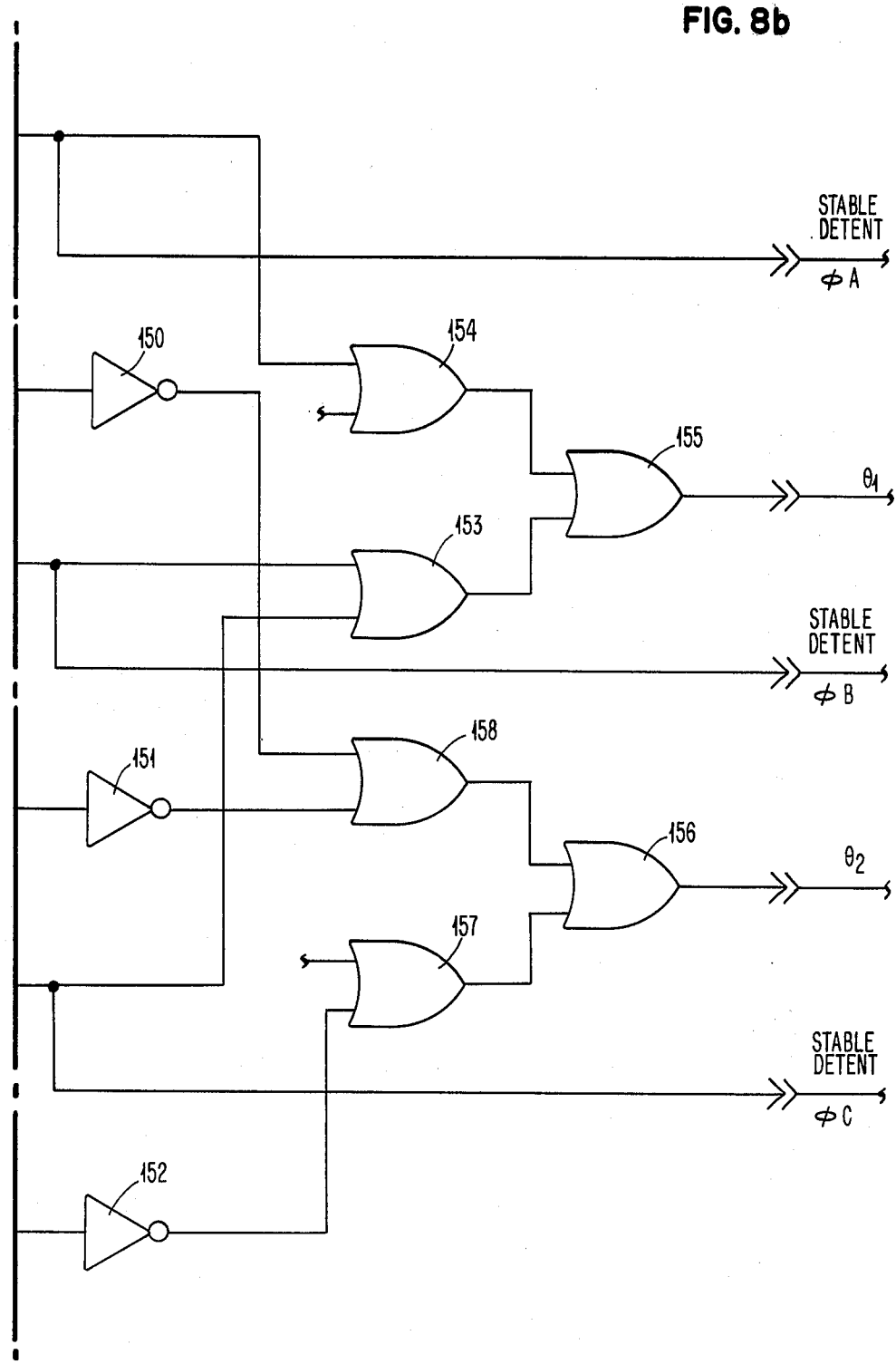

The zero cross-over detecting circuit 140 detects the cross-over point for stable detent (negative slope) for both the input signals $V_{bA}-V_{bC}$ and the sum signals for two phases $V_{bAB}-V_{bCA}$, and OR's the appropriate signals together to obtain the outputs illustrated in FIG. 8b.

Turning once again to FIG. 8a, the signals $V_{bA}-V_{bC}$ are each applied to comparators 141–143, the output signals of the comparators being applied to a differentiator comprising one of the capacitor resistor combinations C4, R19; C7, R25; or C11, R33. The resulting differential signal then passes through a diode D4, D6, D8 and then to an invertor 144–146 respectively and shaping circuit comprising the resistor capacitor combinations R18, C5; R26, C8; R34, C12. As shown in FIG. 8b the output of the invertors 144–146 is bifurcated, one output being applied as a source of synchronization pulses directly to the microprocessor 200. In FIG. 8b, these pulses are labeled ΦA-ΦC respectively which corresponds, in the present instance, to the stable detent or negative slope cross-over points. The signal outputs of the invertors 144–146 are also OR'ed through OR gates 153–155 to provide a pulse train output, $\theta_1$. Moreover, an examination of FIG. 8a will show that the signal outputs from the summing amplifiers 91a–91c is applied directly to comparators 147–149, the outputs of which are applied to similar differentiation circuits comprising capacitors C6, R40; C9, R31; and C15, R39. The signal outputs of the differentiation circuits are applied to invertors 150–152 respectively, the outputs of which are in turn OR'ed through OR gates 156–158, to provide a pulse train output, $\theta_2$. The pulse train outputs $\theta_1$ and $\theta_2$, inasmuch as the test is conducted at constant rotor 12 rotational speed, contains information which is proportional to the distance between steps.

The pulse trains $\theta_1$, $\theta_2$ are applied to a hardware timer 170 which converts the time between pulses into a digital number proportional to the time between steps, i.e., $\Delta\theta_2$, $\Delta\theta_1$ which is applied to the microprocessor 200 to determine the stepping error as discussed in the section entitled "Step Accuracy Measurement". Thus in equation (6) of that section the processor searches the train of times represented by the digital numbers $\Delta\theta_1$ to find both the minimum and maximum time and then converts that to a percentage stepping error as shown in equation (6).

In a similar manner, the pulse train $\theta_2$, after passing through the hardware timer 170 and being converted to a digital number $\Delta\theta_2$ is processed as illustrated in equation (7).

The microprocessor 200 is contained on a microprocessor board, and may include any one of the well known microprocessor or microprocessor families. In the illustrated instance, an Inten ISBC8030 card, multi-bus microcomputer with an 8085 microprocessor is preferably employed utilizing 8253 hardware timers on the card or board. The 8253 hardware timers correspond to the hardware timers 170 which receive the train of pulses $\theta_1$, $\theta_2$. The microcomputer or microprocessor board also includes an A/D convertor (analog-to-digital) which converts the analog voltages applied by the tester to the microprocessor to corresponding digital values which then are processed conventionally by the miroprocessor to provide the motor parameters as set forth adjacent the appropriate lines on block diagram FIG. 3. The values or parameters derived by the microprocessor are in accordance with the description contained herein relative to the parameters and the equations (1)–(38) as described heretofore.

It should be clear from the foregoing that the equations that have been described and defined heretofore relative to the motor test parameters are analog equations and that in many cases the parameter values have units of voltage or the like as opposed to pure digital numbers. However, it is believed that the equations derived will permit the application of the method of the present invention to any microprocessor or any suitable computer.

If the method of the present invention is to be employed with an on-line tester wherein the motors are to be tested one after another, it is a simple matter for the miroprocessor to be fitted with a display which simply indicates a pass or fail condition to the operator. Moreover, the microcomputer may be connected to a monitor or video display which indicates such a pass or fail condition or reads out and/or compares the motor parameters with predetermined acceptable parameters, such as indicated in the table included in the specification.

With the method of testing stepping motors utilizing a tester as described above, actual readout data may be compared and then examined to determine any trends, for example, stator to rotor gap trends, etc. so that wear in manufacturing machinery for the motor may be analyzed for replacement before the motors become unacceptable due to some manufacturing defect.

Thus the method of the present invention simply by connecting all phases of the motor in series, rotating the rotor at a uniform speed, determining the back EMF of each of the phases of the motor under test, and then analyzing the same for comparison against optimum motor parameters to determine whether the motor meets the required predetermined motor characteristics, allows for extremely rapid testing of the motor.

Although the invention has been described with a certain degree of particularlity, it is understood that the present disclosure has been made only by way of example and that numerous changes in the details of construction, the combination and arrangement of parts, and the method of operation may be made without departing from the spirit and scope of the invention as hereinafter claimed:

What is claimed is:

1. A method of testing a stepping motor having a stator with a plurality of phases and a rotor, comprising the steps of:
   connecting the phases of the motor under test in series;
   applying a constant current to said phases;
   rotating said rotor of said motor at a constant speed;
   detecting a voltage drop across at least one phase and converting said detected voltage drop into back EMF for said at least one phase;
   analyzing the back EMF of at least said one phase to determine a parameter of said motor.

2. A method of testing a stepping motor in accordance with claim 1 including the steps of comparing said parameter with a known comparable parameter to determine the acceptability of said stepping motor.

3. A method in accordance with claims 1 or 2 including the steps of detecting the voltage drop across each phase and converting the detected voltage of each phase into back EMF for each of said phases.

4. A method in accordance with claim 3 including the steps of analyzing the back EMF of said phase to determine the stepping accuracy of said phase, and comparing the determined stepping accuracy with a predetermined stepping accuracy.

5. A method in accordance with claim 3 including the steps of analyzing the back EMF of each said phases by applying several constant current levels to determine the running torque of said motor, and comparing the determined running torque of said motor with a predetermined running torque.

6. A method in accordance with claim 3 including the steps of measuring the time for a predetermined current rise after application of current to said series connected phases, and analyzing said current rise to determine the average inductance of said phases, and comparing the determined average inductance with a predetermined average inductance.

7. A method in accordance with claim 3 including the steps of analyzing the back EMF of each of said phases to determine the hysteretic losses of said motor, and comparing the hysteretic losses with a predetermined hysteretic loss.

8. A method in accordance with claim 3 including the steps of analyzing the back EMF of each of said phases to determine the phase-to-phase variation in torque between said phases, and comparing the phase-to-phase variation in said torque with a predetermined phase-to-phase variation.

9. A method in accordance with claim 3 including the steps of analyzing the back EMF of each of said phases to determine the back EMF variation per revolution of said motor, and comparing the back EMF variation per revolution with a predetermined back EMF variation per revolution.

10. A method in accordance with claim 3 including the steps of analyzing the back EMF of each of said phases to determine the damping potential of said motor, and comparing the damping potential of said motor with a predetermined damping potential.

11. A method in accordance with claim 3 including the steps of analyzing the back EMF of each of said phases to determine the gap width between the rotor of said motor and the stator of said motor, and comparing the determined gap width with a predetermined gap width.

12. A method in accordance with claim 3 including the steps of analyzing the total voltage across all of said phases to determine average resistance and the absence of shorts in each of said phases, and comparing the value found thereby with a predetermined value.

13. A method in accordance with claim 12 including the step of analyzing said value found to determine the harmonic content of each of said phases, and comparing the determined harmonic content with a predetermined harmonic content.

14. A method in accordance with claim 3 including the step of measuring the voltage drop across all of said phases at a known current through said phases, analyzing said voltage drop across said phases to determine the resistance of said phases, and comparing the determined resistance with a predetermined resistance.

15. A method of testing a stepping motor having a stator with a plurality of phases and a rotor for rotation within said stator, comprising the steps of:
coupling the rotor of said motor to a source of constant speed, unidirectional rotation;
connecting the phases of said motor in series;
connecting a controlled, constant current source in series with said series connected phases of said motor;
rotating the rotor of said motor at a constant speed;
applying a constant current through the series connected phases of said motor;
measuring the voltage drop across each of said phases and converting said voltage drop into back EMF for each of said phases, and
analyzing said back EMF of said phases to determine a plurality of parameters of said motor.

16. A method of testing in accordance with claim 14 including the steps of comparing said plurality of motor parameters with predetermined known parameters, and determining therefrom the acceptability of said motor.

17. A method in accordance with claim 15 or 16 including the steps of analyzing the back EMF of each of said phases to determine the hysteretic losses of said motor.

18. A method in accordance with claim 15 or 16 including the steps of analyzing the back EMF of each of said phases to determine the phase-to-phase variation in torque between said phases.

19. A method in accordance with claim 15 or 16 including the steps of analyzing the back EMF of each of said phases to determine the back EMF variation per revolution of said motor.

20. A method in accordance with claim 15 or 16 including the steps of analyzing the back EMF of each of said phases to determine the damping potential of said motor.

21. A method in accordance with claim 15 or 16 including the steps of analyzing the back EMF of each of said phases to determine the gap width between the rotor of said motor and the stator of said motor.

22. A method in accordance with claim 15 or 16 including the steps of measuring the voltage drop across all said phases, and analyzing the measured value to determine the absence of shorts in each of said phases.

23. A method in accordance with claim 22 including the step of analyzing said measured value found to determine the harmonic content of said phase.

24. A method in accordance with claim 22 including the step of analyzing the measured value found of all said phases to determine the resistance of said phases.

25. A method in accordance with claim 15 or 16 including the steps of measuring the time for current rise after application of current to said series connected phases, and analyzing said current rise to determine the average inductance of said phases, and comparing the determined average inductance with a predetermined average inductance.

26. A method of testing a stepping motor having a stator with a plurality of phases and a rotor, comprising the steps of:
applying a constant current at at least one of several current levels to one or more of said plurality of phases;
rotating said rotor of said motor at a constant speed;
detecting a voltage drop across at least one phase and converting said detected voltage drop into back EMF for said at least one phase;
analyzing the back EMF of at least said one phase to determine a parameter of said motor.

27. A method of testing a stepping motor in accordance with claim 26 including the step of connecting all of said phases in series.

28. A method in accordance with claim 26 wherein at least one of said current levels is zero.

29. A method in accordance with claims 26 or 27 or 28 including the steps of analyzing the back EMF of each of said phases to determine the running torque of said motor, and comparing the determined running torque of said motor with a predetermined running torque.

* * * * *